PROCESS FOR MAKING AND TESTING SEMICONDUCTIVE DEVICES

Filed July 13, 1965

INVENTOR.
ROBERT A. DI CURCIO
BY
Shenier & O'Connor
ATTORNEYS

United States Patent Office 3,461,547
Patented Aug. 19, 1969

3,461,547
PROCESS FOR MAKING AND TESTING SEMICONDUCTIVE DEVICES

Robert A. Di Curcio, Rockville, Conn., assignor to United Aircraft Corporation, East Hartford, Conn., a corporation of Delaware Filed July 13, 1965, Ser. No. 471,678
Int. Cl. B01j 17/00; H01l 7/00
U.S. Cl. 29—574 6 Claims

ABSTRACT OF THE DISCLOSURE

A process for making semiconductive devices includes measuring the bulk lifetime of excess carriers at a plurality of discrete points in a substrate, forming a junction in the substrate at a point where the lifetime measurement is satisfactory, and measuring the abruptness of the junction at a plurality of discrete points. If the abruptness measurements are not satisfactory, the process includes the further forming of the junction and the regulation of subsequently formed junctions.

A process for measuring the bulk lifetime of excess carriers in a substrate comprises partially saturating the surface recombination centers, producing excess carriers within the substrate, and measuring the time-constant of recombination of the excess carriers.

A process for measuring the abruptness of a junction comprises subjecting the junction to a varying voltage, directing radiation at the junction of a wave-length not less than the absorption threshold, and measuring the modulation of radiation transmitted through the junction.

Apparatus for measuring the bulk lifetime of excess carriers and for measuring junction abruptness include radiation sources producing very narrow beams so that each measurement can be made at a plurality of discrete points.

Background of the invention

Control of the terminal electrical characteristics of a semiconductive device can be effected only by the process steps involved in its manufacture. There does exist a correlation between the process steps and the resultant electrical characteristics of the device. To preform direct-electrical tests of a semiconductive device, contacts and lead connections must be made. This prevents the rapid correction of the process parameters and results in the destruction of the device if it fails a direct electrical test.

Most semiconductive devices involve a junction between two semiconductors of opposite conductivity types. In general, one of the semiconductors comprises a substrate. The other semiconductor forming the junction may be created by a diffusion into the substrate which changes its conductivity type or by depositing upon the substrate and epitaxial layer of an opposite conductivity type. A property of the substrate which is of interest is its doping, which is a function of the bulk lifetime of excess minority carriers. A property of the junction which is of interest is its abruptness.

The properties of the resultant semiconductive device comprising the junction include the forward resistance, the reverse resistance, and the inverse voltage which it can withstand without breakdown. There are two distinct classes of junctions; namely, "abrupt" junctions and "linearly graded" junctions. As a general rule, for junctions of a given class, a more abrupt junction will exhibit lower forward and reverse resistances and a lesser inverse breakdown voltage; while a less abrupt junction will exhibit higher forward and reverse resistances and a greater inverse breakdown voltage. Substrates of higher doping usually exhibit a short bulk lifetime of excess carriers and are employed in semiconductive devices of high frequency response. Conversely, substrates of lesser doping usually exhibit a longer bulk lifetime and are employed in semiconductive devices of low frequency response. Substrates of higher doping usually yield junctions of greater abruptness than do substrates of lesser doping.

Summary of the invention

One object of my invention is to provide apparatus for determining the bulk lifetime of excess substrate carriers which does not require physical contact with the substrate.

Another object of my invention is to provide apparatus for determining the abruptness of a junction.

A further object of my invention is to provide a process of controlling the characteristics of a junction diffused into a substrate.

Other and further objects of my invention will appear from the following description:

In general, my invention contemplates the provision of apparatus for measuring the bulk lifetime of excess minority substrate carriers and the abruptness of junctions diffused into the substrate which employs radiation to which the semiconductors are substantially transparent. For example, silicon has an absorption edge at 1.13 microns. For longer wave lengths, such as 2 microns, silicon is substantially transparent, while shorter wave lengths, such as 0.7 micron, are strongly absorbed in generating excess carriers in the form of hole-electron pairs. The transmission of infra-red radiation through silicon is dependent upon the density of free carriers, whether they be carriers which occur by virtue of doping or excess carriers created by photo-excitation. I photo-excite the substrate to produce excess carriers which reduce the transmission of infra-red radiation through the substrate. Upon terminating the photo-excitation, the excess carriers recombine; and the infra-red radiation transmitted through the substrate returns to its normal value corresponding to the doping of the substrate. By measuring the time required for infra-red radiation transmitted through the substrate to increase to its normal value upon the termination of photo-excitation, I may determine the lifetime of the excess carriers.

A junction diffused into the substrate introduces a discontinuity in the density of carriers at which infra-red radiation is partially reflected and partially transmitted. This discontinuity is related to the abruptness of the junction. For an abrupt junction, the reflection is high and the transmission is low, while for a more graduated junction the reflection is low and the transmission is high. By measuring the radiation transmitted through the discontinuity, I may determine the abruptness of the junction.

Description of the drawings

In the accompanying drawings which form part of the instant specification and which are to be read in conjunction therewith and in which like reference numerals are used to indicate like parts in the various views.

Figure 1:
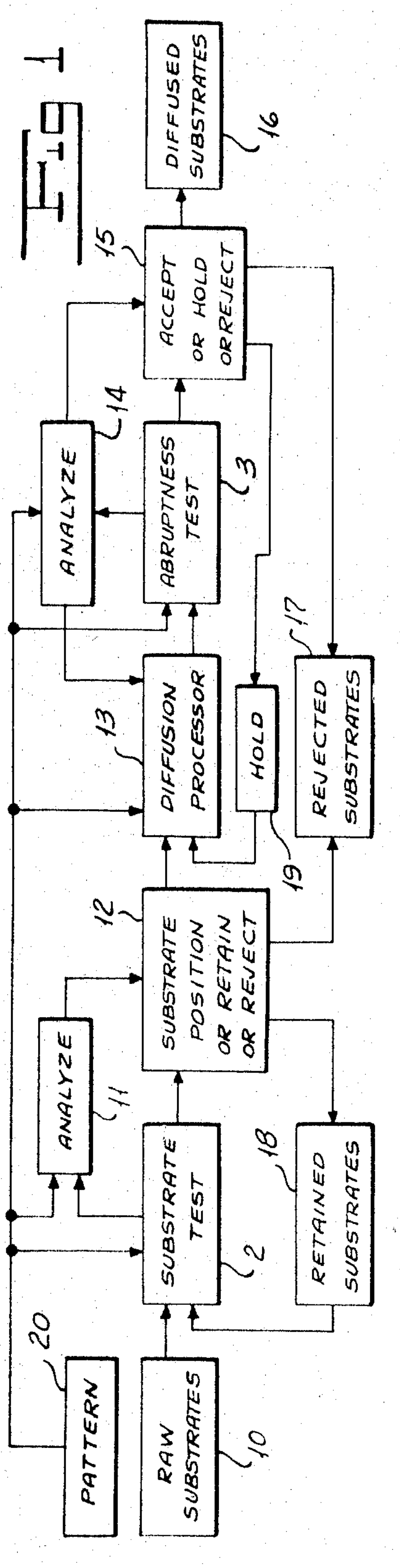
FIGURE 1 is a flow diagram of my process for making and testing semiconductive devices.

Referring now more particularly to FIGURE 1, the raw substrates 10 are conveyed to a substrate test station 2 at which measurement is made of its bulk lifetime at various points where diffusions are to be performed in accordance with a predetermined pattern 20. The results of the substrate test are analyzed as indicated by the reference numeral 11. The analysis may be performed either manually or by appropriate computers as will be appreciated by those ordinarily skilled in the art. The substrate is then conveyed from test station 2 to a station 12 at which the substrate is either oriented to a predetermined position or retained for further testing or entirely rejected.

The lifetime measurements made in the substrate test 2 are performed with the substrate in a certain reference position. The substrate test might, for example, be performed only in those regions to be subjected to diffusions with the substrate in its reference position. In such event, if the results of lifetime tests were within normal limits, the substrate would be passed into the diffusion processor 13 without reorientation from its reference position. On the other hand, if the results of the substrate test showed that only a few points within the regions to be diffused were beyond tolerance limits, then the substrate would be passed to station 18 and thus be retained for further testing in a position different from its reference position, since there would exist the possibility that with a reorientated substrate, the new regions might result in satisfactory carrier lifetime tests. Another method of performing the substrate test 2 is to measure the carrier lifetimes at all points of the substrate. An analysis 11 of these points will then reveal if any possible orientation of the substrate will permit diffusion into only those regions of the substrate having satisfactory carrier lifetimes. If such orientation is possible, then the substrate may be positioned at station 12 in such orientation for delivery to the diffusion processor 13. It will be appreciated that if the substrate test reveals a large number of points of unsatisfactory carrier lifetimes, then the substrate may be delivered to a collection of rejected substrates 17. If the substrate tests reveal a fairly small number of points at which the carrier lifetimes are unsatisfactory and an analysis of such points shows that in no position of the substrate can a diffusion avoid such unsatisfactory points, then the substrates may be delivered to a collection of retained substrates 18. It will be appreciated that while for a given diffusion pattern 20 no position of the substrate will suffice to eliminate points of unsatisfactory lifetimes from the areas of diffusion, yet such substrates may be entirely satisfactory for a different diffusion pattern.

In the diffusion processor an impurity, as for example in the gaseous form, is passed over the substrate and diffuses into the substrate in those regions where its silicon oxide passivation layer has been removed. The various parameters which may be controlled include the concentration of the diffusant, the temperature of the diffusant, the time during which the diffusant is passed over the substrate, and the drive-in time during which the flow of diffusant is terminated while steam or oxygen at an elevated temperature is passed over the substrate. Upon completion of the diffusion in processor 13, the substrate is passed to a station 3 where abruptness tests of the diffused junction are performed. The results of the abruptness tests are analyzed as indicated by the reference numeral 14. Again the analysis may be performed either manually or by general purpose computers well known to the art. As a result of the analysis 14 of tests 3, corrective feedback may be immediately applied to processor 13 to improve the junctions diffused into subsequent substrates. The substrates are conveyed from the testing station 3 to station 15, at which a diffused substrate is either accepted or held for reprocessing or entirely rejected. If the diffused substrate passes the tests 3, then it is conveyed from station 15 to a collection of satisfactory diffused substrates 16. If the analysis 14 shows that no reprocessing can produce a satisfactory junction, then the substrate is conveyed from station 15 to the collection of rejected substrates 17. If the analysis 14 of the tests 3 shows that the substrate can be reprocessed to produce a satisfactory junction, then it is conveyed from station 15 to station 19 where it is held for subsequent delivery to the diffusing processor 13. For example, if the junction exhibits excessive abruptness at certain points and insufficient abruptness at other points, then it may be rejected to station 17; if various points of the junction uniformly exhibit insufficient abruptness, then the substrate may be delivered by way of station 19 to the processor 13 and subjected to a greater diffusant concentration and a reduced drive-in time; and if the junction uniformly exhibits an excessive abruptness, the substrate may be returned, by way of station 19, to the processor 13 for further drive-in.

Figure 2:
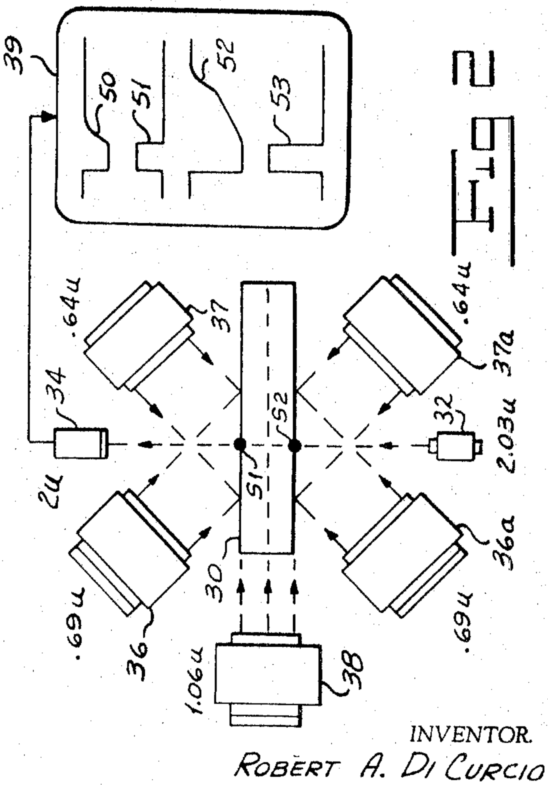
FIGURE 2 is a schematic view showing apparatus for measuring the bulk lifetime of excess substrate carriers.

Referring now to FIGURE 2, a gas laser 32 provides a continuous pencil beam of radiation having a wave length of 2.03 microns. Such wave length may be provided by a mixture of gases comprising 250 parts helium to 1 part xenon. Since the absorption edge of silicon is 1.13 microns, the substrate 30 is substantially transparent to the radiation emitted by laser 32. The pencil beam from laser 32 may have a diameter of 2 mils, and, after passing through the substrate, is sensed by an infra-red detector 34 which responds over a frequency band which includes wave lengths of 2 microns. Detector 34 may comprise indium antimonide or indium arsenide for fast response. Detector 34 may be provided with a germanium input filter. The germanium filter has an absorption edge at 1.8 microns and should be sufficiently thick to provide complete absorption at 1.1 microns so that scattered radiation from a laser 38 will not affect detector 34. A ruby laser 36 emits radiation with a wave length of .69 micron in a broad beam which impinges upon the upper surface of substrate 30 about the point S1 where the infra-red pencil beam from laser 32 emerges. The wave length of radiation provided by the ruby laser 36 is much less than the absorption edge of the silicon substrate 30; and this radiation is absorbed substantially at the surface of the substrate. Laser 36 may be Q-switched to provide radiation pulses having a relatively rapid decay. Such Q-switching is readily achieved by providing a rotating mirror which periodically forms part of a resonant reflecting cavity with which the ruby is coupled. Alternately fixed resonant circuit mirrors may be used in conjunction with a plate of uranium glass or other amplitude-sensitive glass interposed between the ruby and either mirror.

A gas laser 37 emits a continuous broad beam of radiation of .64 micron wave length which is directed to impinge upon the upper surface of substrate 30 about the point S1. The wave length of gas laser 37 is well below the absorption edge of silicon so that the radiation is absorbed substantially at the surface of the substrate. Laser 37 may comprise a helium-neon mixture. A Q-switched ruby laser **36*a* provides pulses of radiation of .69 micron wave length in the form of a broad beam which is directed to impinge upon the lower surface of the substrate 30 about point S2 where the infra-red radiation from laser 32 enters the substrate. A continuous gas laser 37*a* provides radiation of .64 micron wave length in the form of a broad beam which impinges upon the lower surface of substrate 30 about point S2. Lasers 37 and 37*a*** may alternatively comprise helium-neon mixtures which emit at a wave length of .73 micron.

The neodymium glass laser 38 emits a beam of radiation of wave length 1.06 microns. This wave length is somewhat less than the absorption edge of silicon. To such wave length silicon is only partially transparent. The radiation passes completely through the substrate; and during the gradual absorption process excites excess carriers throughout the bulk of the substrate. Because of internal reflection, all volumes of the substrate are excited even though such volumes may not be in the direct path of the beam from laser 38. Conveniently laser 38 may provide a broad beam. Laser 38 is Q-switched to provide output pulses of fast decay. Detector 34 is coupled to the Y axis input of an oscilloscope 39 which may be provided with a synchronized X axis sweep.

In operation of the substrate testing apparatus of FIGURE 2, the continuous gas lasers 37 and 37*a* are provided with sufficiet direct-current flow through their ionized gas mixtures to generate an intensity of excitation in the upper and lower surfaces surrounding points S1 and S2 such that the number of excess carriers partially fills the surface traps and thus partially saturates the surface recombination centers. While traps are present throughout the bulk of the substrate, they are much more numerous at the surfaces since there are no adjacent atoms. The number of traps in the bulk of the substrate depends upon the degree of doping and upon the number of internal lattice discontinuities or defects. However, the entire surface of the substrate represents a lattice discontinuity or defect. Furthermore, the number of surface traps is dependent upon the surface treatment, rough surfaces having considerably more traps than smooth surfaces. Because of the larger number of surface than bulk traps in the substrate, the lifetime of excess surface carriers is much smaller than the lifetime of the excess bulk carriers. Measurement of the bulk lifetime is thus obscured. By providing a steady surface excitation from lasers 37 and 37*a*, I continuously replenish the excess carriers lost in the surface traps. The effect is somewhat the same as if the thickness of the substrate were several centimeters instead of only 5 to 20 mils for example. The problem is to determine the proper intensity of steady state excitation from lasers 37 and 37*a* which effectively neutralizes the surface discontinuity.

Initially the intensity of the outputs of lasers 37 and 37*a* may be made equal to some assumed value for the proper intensity. Then laser 38 is energized by exciting its neodymium glass with a flash lamp. Excess carriers are produced throughout the bulk of the substrate. Gas laser 32 is continuously energized. In the presence of the excess carriers, the absorption of the substrate to radiation of laser 32 is increased; and the infrared radiation detected by sensor 34 is reduced. Upon the termination of the pulse from laser 38, the excess carriers throughout the bulk of the substrate recombine. During the period of recombination, the output from detector 32 increases exponentially to its original value. The lifetime of the excess bulk carriers is determined from the time-constant of the change in the output of detector 34. The oscilloscope 39 may provide a controlled X axis sweep rate so that the decay time can accurately be determined. Subsequently laser 36 is energized by exciting its ruby with a flash lamp. During the period of the pulse, excess carriers are produced only in the upper surface of the substrate surrounding point S1. These excess carriers diffuse through the substrate to the lower surface. The diffusion length of excess carriers may be of the order of magnitude of 1 millimeter. This means, for example, that the density of excess carriers originating at one point is diminished by a factor of $e^{-1}=.37$ at a point 1 millimeter removed from the point of origin. It is because of this diffusion length that measurement of the bulk lifetime is unsatisfactory unless the samples have dimensions of approximately two centimeters. If the substrate has a thickness of 20 mils and the diffusion length is 1 mm.=40 mils, then the density of excess carriers at the lower surface will be $e^{-1/2}=0.6$ the density of carriers at the upper surface. Lasers 36, 37, 36*a*, and 37*a*, may provide beams having diameters appreciably greater than the thickness of the substrate so that lateral diffusion may be neglected compared with the diffusion of carriers normal to the surfaces of the substrate. These lasers may provide beam diameters exceeding 200 mils. Thus immediately prior to the trailing edge of a pulse from laser 36, an exponentially decreasing profile of carrier density is achieved between the upper and lower surface. Upon the termination of a radiation pulse from laser 36, the excess carriers in the substrate decay and the radiation received by detector 34 increases to its normal value. The time-constant with which the carriers recombine depends upon the recombination rate at the upper surface, upon the bulk recombination rate, and upon the recombination rate at the lower surface. However, since the density of excess carriers is greatest at the upper surface, the time-constant of recombination as measured by detector 34 will be most greatly affected by the recombination rate at the upper surface. The intensity of excitation of continuous laser 37 is adjusted until the time-constant of recombination in response to pulses from laser 36 is precisely equal to the time-constant in response to pulses from laser 38. For example, if the time-constant determined by pulses from laser 36 is too short, then the excitation of laser 37 should be increased to saturate more surface traps and thus decrease the recombination rate of excess carriers at the upper surface of the substrate. The next step is to energize laser 36*a* by exciting its ruby with a flash lamp. In this case, the density of excess carriers is greatest at the lower surface and exponentially decreases towards the upper surface. The intensity of pulses provided by laser 36 and 36*a* should be sufficiently high to produce a number of excess carriers which is an appreciable fraction of the carriers present by virtue of doping so that an appreciable reduction in transmission will result. However, the intensity of pulses provided by lasers 36 and 36*a* should not be so high that the number of excess carriers appreciably exceeds the carriers present by virtue of doping, since this would saturate the bulk recombination centers and greatly increase the apparent diffusion length. This would result in a substantally uniform distribution of excess carriers throughout the substrate instead of the desired exponential density distribution. The time-constant as measured by the rate of change in output of detector 34 is adjusted by changing the steady illumination from gas laser 37*a* until it is equal to the time-constant determined in response to a pulse from laser 38. The adjustments of lasers 37 and 37*a* are not independent. The entire process is then repeated. If the original settings of lasers 37 and 37*a* were not correct, then the time-constants as determined by pulses from laser 38 will be slightly changed. This will necessitate an additional minor adjustment in the intensity of laser 37. Similarly a minor adjustment in the output of laser 37*a* may be necessitated. The iterative process rapidly converges. Once lasers 37 and 37*a* have been thus adjusted, the true bulk lifetime is determined by the time-constant of the change in output of detector 34 in response to pulses from laser 38 only when pulses from lasers 36 and 36*a* provide the same time-constants. This means that all surface effects are substantially neutralized and the apparent thickness of the substrate is infinite. Once lasers 37 and 37*a* have been adjusted for surface neutralization in measuring the bulk lifetime of the substrate at one point, only minor readjustments in intensity may be required for proper surface neutralization in measuring the bulk lifetime at various other points. It will be appreciated that lasers 37 and 37*a* may be simultaneously adjusted to equal intensities so that one of lasers 36 and 36*a* may be eliminated.

It will also be appreciated that laser 38 may be eliminated. In such event its effect may be retained by increasing the intensity of laser 36 to saturate the bulk recombination centers and increase the apparent diffusion length. Laser 36 is initially excited with a high intensity flash to produce a uniform distribution of carriers. For such application a rapid decay of radiation is not of significance; and laser 36 need not be Q-switched. The initial recombination of excess carriers proceeds at a very low rate until the number of excess carriers is sufficiently reduced that the bulk recombination centers become unsaturated. The period of the slow initial recombination is ignored in determining the true time-constant of recombination. Then laser 36 is excited with a low intensity flash to produce a nonuniform distribution of excess carriers. Lasers 37 and 37*a* may then be simultaneously adjusted so that the time-constant as determined from a low intensity pulse from laser 36 is equal to the terminal time-constant from a high intensity pulse from laser 36. The steps are then repeated until the two time-constants are equal.

In the oscilloscope tracings, curve 50 shows the output from detector 34 in response to a low intensity pulse 51; and curve 52 shows the output from detector 34 in response to a high intensity pulse 53. It will be noted that the true time-constant for high intensity pulses can be determined only from the terminal portion of curve 52 where the bulk recombination centers are no longer saturated.

As previously pointed out, laser 38 may be Q-switched if it provides a low intensity pulse. However, for a high intensity pulse output from laser 38, fast decay is not important; and no Q-switching need be provided.

Figure 3:
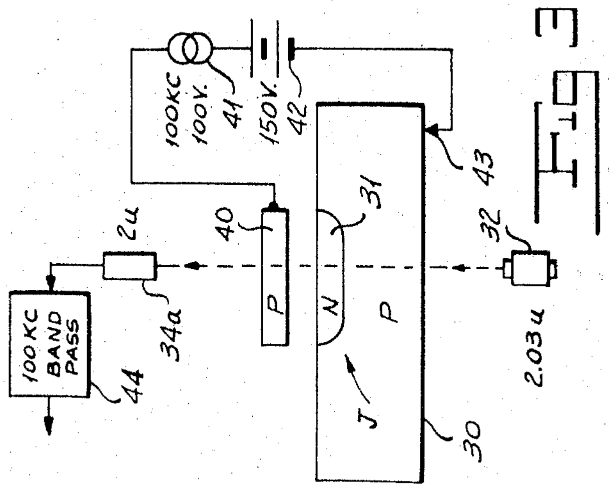
FIGURE 3 is a schematic view showing apparatus for measuring the abruptness of a junction.

Referring now to FIGURE 3, a continuous gas laser 32 provides a 2 mil diameter beam of 2.03 micron radiation which is directed normally to substrate 30 in the region of a diffused area 31. For example, the substrate 30 may be of p type conductivity; and the diffused region 31 may be of n type conductivity. At the boundary between the two regions there exists a junction J. Placed over the region 31 is a thin layer 40 of p type silicon or selenium. Selenium has an absorption edge at 0.5 micron and is thus transparent to the beam from laser 32. The beam from laser 32 passes through the substrate, then through the junction J, then the diffused region 31 and finally through layer 40 where it impinges upon a detector 34*a*, which is similar to detector 34 except that no germanium input filter is provided. The upper surface of substrate 30 and the diffused region 31 may be covered by a thin film of silicon dioxide. This passivating insulating layer is transparent to infra-red radiation from laser 32. The silicon wafer 40 may also be passivated with an oxide coating. Wafer 40 may be placed either in close proximity to the surface of substrate 30 or may be allowed to rest lightly upon the surface thereof with both oxide layers in contact. An electrical connection with wafer 40 is coupled to one terminal of an oscillator 41 which may provide an output of 100 peak volts at a frequency of 100 kilocycles. The other terminal of oscillator 41 is connected to the positive terminal of 150 volt battery 42. The negative terminal of battery 42 is connected to a contact 43 which engages the under surface of substrate 30 with sufficient pressure to penetrate the oxide coating and thus make electrical contact with substrate 30. The output of detector 34*a* is applied to a band pass amplifier 44, which has a maximum tuned response at 100 kilocycles.

In operation of the apparatus of FIGURE 3 the infra-red beam from laser 32 is partly reflected from and partially transmitted through the junction J. The amount of radiation reflected depends upon the abruptness of the junction. Highly abrupt junctions reflect more light than do more graduated junctions. Reflection occurs not only at the boundary between the p type material and the depletion region but also at the boundary between the depletion region and the n type material 31. When a junction is forwardly biased, the depletion region becomes narrower and the gradient of free carrier density increases. When the junction is backwardly biased, the depletion region widens and the free carrier density gradient decreases. Accordingly, a forwardly biased junction reflects more radiation than does a backwardly biased junction. Voltages are capacity coupled to region 31 by the wafer 40. For example, assume that the junction capacitance is 1 picofarad and the capacitance between wafer 40 and region 31 is .01 picofarad. These two capacitances in series act as a 100 to 1 voltage divider so that region 31 is subjected to one peak volt. Since silicon exhibits a low resistance for forward voltages exceeding approximately 0.5 volt, and since the average current through the junction must be zero, region 31 varies from a potential which is 0.5 volt positive relative to substrate 30 to a potential which is 1.5 volts negative relative to substrate 30. The variation in voltage across the junction modulates the infra-red radiation reflected at the junction and therefore varies the radiation transmitted through the junction which is sensed by detector 34*a*. The frequency of oscillator 41 may be sufficiently high that the capacitive reactance of the junction is small compared with the incremental back resistance of the junction. Battery 42 is provided to insure that no surface inversions are induced in either region 31 or wafer 40. Such induced surface inversions would create additional reflecting junctions which would interfere with the measurement. Even at the peak negative excursion of oscillator 41, wafer 40 is positive relative to region 31 by approximately 50 volts. Since wafer 40 is always positive relative to region 31, only positive charges are induced on the lower surface of wafer 40; and only negative charges are induced on the upper surface of region 31. The polarities of induced charges on the opposing surfaces are such as to augment the carriers produced by doping.

It will be appreciated that if the substrate were formed of n type material and region 31 were formed of p type material then wafer 40 may be formed of n type material; and the connections to battery 42 should be reversed so that the potential of wafer 40 is always more negative than that of region 31. The amplitude of the tuned output from amplifier 44 is a measure of the abruptness of the junction J.

It will be seen that I have accomplished the objects of my invention. I have provided apparatus for determining the true bulk lifetime of excess carriers in a substrate. I have provided apparatus for determining the abruptness of a junction created by a diffusion into or by an epitaxial deposition upon the substrate. Both of these measurements are made in small well-defined areas which permits of the sampling of the substrate and of the diffused or deposited junction at a large number of points. I have provided a process for making a semiconductive device in which the process steps are varied until the results of the lifetime and abruptness tests are within desired limits.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is, therefore, to be understood that my invention is not to be limited to the specific details shown and described.

Having thus described my invention, what I claim is:

1. A process for making a semiconductive device including the steps of measuring the bulk lifetime of excess carriers in a substrate; governing, in accordance with the lifetime measurement, the position on the substrate at which a p-n junction is to be formed; forming at such position a junction in the substrate; measuring the abruptness of the junction; and further forming the junction in accordance with the abruptness measurement.

2. A process for making a series of semiconductive devices including the steps of forming a first p-n junction in a first substrate; measuring the abruptness of the first junction; measuring the bulk lifetime of excess carriers in a second substrate; governing, in accordance with the lifetime measurement, the position on the second substrate at which a second junction is to be formed; forming at such position a second junction in the second substrate; and governing the second junction forming step in accordance with the abruptnes measurement of the first junction.

3. A process for making a series of semiconductive devices including the steps of forming a first p-n junction in a first substrate; measuring the abruptness of the first junction at a plurality of points; further forming the first junction in accordance with the abruptness measurements; measuring the bulk lifetime of excess carriers at a plurality of points in a second substrate; governing, in accordance with the lifetime measurements, the position on the second substrate at which a second junction is to be formed; forming at such position a second junction in the second substrate; and governing the second junction forming step in accordance with the abruptness measurements of the first junction.

4. A process for making a semiconductive device including the steps of measuring the bulk lifetime of excess carriers at a plurality of points in a substrate; governing, in accordance with the lifetime measurements, the position on the substrate at which a p-n junction is to be formed; and forming at such position a junction in the substrate.

5. A process for making a semiconductive device including the steps of forming a p-n junction in a substrate, measuring the abruptness of the junction at a plurality of points, and further forming the junction in accordance with the abruptness measurements.

6. A process for making a series of semiconductive devices including the steps of forming a first p-n junction in a first substrate, measuring the abruptness of the first junction at a plurality of points, forming a second p-n junction in a second substrate, and governing the second junction forming step in accordance with the abruptness measurements of the first junction.

References Cited

UNITED STATES PATENTS

| | | | |
|---|---|---|---|
| 2,746,121 | 5/1956 | Anderson | 29—574 X |
| 2,790,952 | 4/1957 | Pietenpol | 29—574 X |
| 2,970,411 | 2/1961 | Trolander | 29—610 X |
| 3,109,932 | 11/1963 | Spitzer. | |
| 3,134,077 | 5/1964 | Hutchins et al. | |
| 3,195,218 | 7/1965 | Miller et al. | 29—578 |

JOHN F. CAMPBELL, Primary Examiner

WILLIAM I. BROOKS, Assistant Examiner

U.S. Cl. X.R.

29—576; 148—1.5